(12) United States Patent
Hughes et al.

(10) Patent No.: US 6,393,607 B1
(45) Date of Patent: May 21, 2002

(54) AC PORT DEVICE FOR CABLE TELEVISION TAP

(75) Inventors: Jeffrey P. Hughes; Alan J. Schlenz, both of Lawrenceville, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/238,960

(22) Filed: Jan. 27, 1999

(51) Int. Cl.[7] ............................................. B60B 35/00
(52) U.S. Cl. ................... 725/130; 725/128; 725/149; 725/150; 455/3.03; 333/126; 333/129
(58) Field of Search .................... 725/149, 150, 725/127, 128, 130; 455/3.03; 333/136, 132, 134, 126, 129

(56) References Cited

U.S. PATENT DOCUMENTS

| | | | |
|---|---|---|---|
| 5,109,286 A | * 4/1992 | West, Jr. et al. | 725/127 |
| 5,738,525 A | * 4/1998 | Davies | 434/219 |
| 5,781,844 A | * 7/1998 | Spriester et al. | 725/149 |
| 5,845,190 A | * 12/1998 | Bushue et al. | 725/130 |
| 5,909,154 A | * 6/1999 | Brown et al. | 333/100 |
| 6,033,101 A | * 3/2000 | Reddick et al. | 700/286 |
| 6,067,441 A | * 5/2000 | Pan | 725/150 |

\* cited by examiner

*Primary Examiner*—Andrew Faile
*Assistant Examiner*—Jason Sake
(74) *Attorney, Agent, or Firm*—Hubert J. Barnhardt, III; Kenneth M. Massaroni; Shelley L. Couturier

(57) ABSTRACT

A cable television tap (500) for receiving a forward signal including an information signal and a power signal. The tap (500) includes a diplex filter (520) for receiving the forward signal and for separating the information signal from the power signal at outputs of the diplex filter (520) and a plurality of subscriber ports (535) coupled to an output of the diplex filter (520) for receiving the information signal such that the information signal can be accessed at each of the plurality of subscriber ports (535). The tap (500) also includes a removable port device (555) coupled to the other output of the diplex filter (520) for receiving the power signal, and the port device (555) has a connector (550) so that the power signal can be accessed. According to the present invention, when the port device (555) is coupled to the tap (500), the information signal can only be accessed at the subscriber ports (535), and the power signal can only be accessed at the connector (550) of the port device (555). This provides a way to separately transmit the information signal and the power signal over the subscriber property to the subscriber.

4 Claims, 8 Drawing Sheets

AC PORT DEVICE FOR CABLE TELEVISION TAP

FIELD OF THE INVENTION

This invention relates generally to cable television systems and taps used in such systems, and more specifically to the provision of AC power to subscriber premises in a cable television system.

BACKGROUND OF THE INVENTION

Cable television systems typically transmit information signals to subscriber equipment, such as televisions, telephones, set top units, and computers. The cable television system generally includes headend equipment for transmitting and information signal and taps that tap the signal off to system subscribers. Such a cable television tap includes an input port for receiving the signal, and output port for passing the signal through to other portions of the distribution system, and subscriber ports, each of which couples a portion of the signal to a subscriber. A tap commonly includes four, eight, or sixteen subscriber ports, although an even larger number of subscriber ports can be included if necessary.

AC (Alternating current) power can also be provided through the cable television system for powering telephones and other subscriber equipment. In this case, the AC power typically travels through the same distribution system, including the taps, so that it can be provided to the subscriber on the same communication medium that provides the information signal. However, regulations in some geographic regions prohibit the provision of information signals and AC power to subscriber equipment on a single coaxial cable that is run from the main cable television line to the house or other subscriber premises. Therefore, in at least one conventional configuration, a system operator has been required to provide devices for splitting the AC power from the information signal so that the AC power can be transmitted to the subscriber premises using twisted pair cables while the information signal is transmitted from the tap to the subscriber premises using conventional coaxial cables. A disadvantage to the use of this type of device, however, is that a separate filter device must be connected to the output of each subscriber port of each tap. As a result, modification of the cable television system hardware in this manner can become very expensive and very labor intensive.

Thus, what is needed is a better way to separately provide AC power and information signals to subscribers in a cable television system.

DETAILED DESCRIPTION OF A PREFERRED EMBODIMENT

Figure 1:
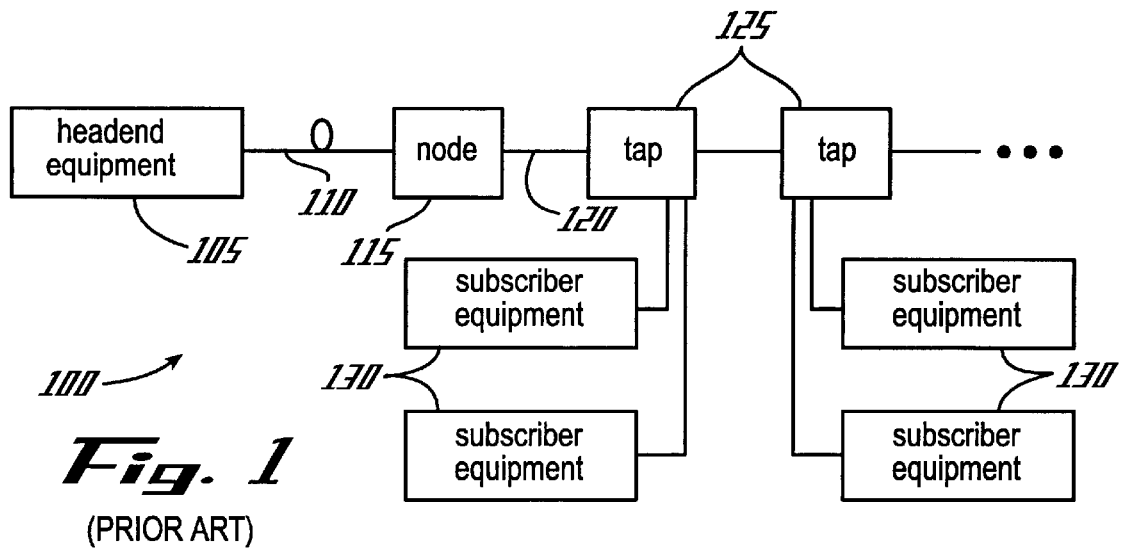
FIG. 1 is an electrical block diagram of a conventional cable television system.

FIG. 1 is an illustration of a conventional cable television system 100 including headend equipment 105 for transmitting information signals, such as video, audio, and/or data signals, throughout the system 100 in the downstream, or forward, direction. These signals can include telephone signals as well, and the telephone signals may be transmitted by the headend equipment 105 or may enter the system 100 from another source (not shown).

Information signals are preferably transmitted from the headend equipment 105 in an optical format over fiber optic cable 110. The optical information signals are processed by an optical node 115, which converts the optical information signals to electrical information signals for further transmission within the system 100. The node 115 can include a power supply (not shown) for generating an AC power signal that is also transmitted throughout the cable television system 100, in which case the forward electrical signal includes an information signal component and an AC power signal component. The forward signal is transmitted from the node 115 over another communication medium, such as coaxial cables 120, and taps 125 situated downstream from the node 115 tap off portions of the forward signal for provision to subscriber equipment 130, such as set top units, televisions, modems, computers, and telephones.

Figure 2:
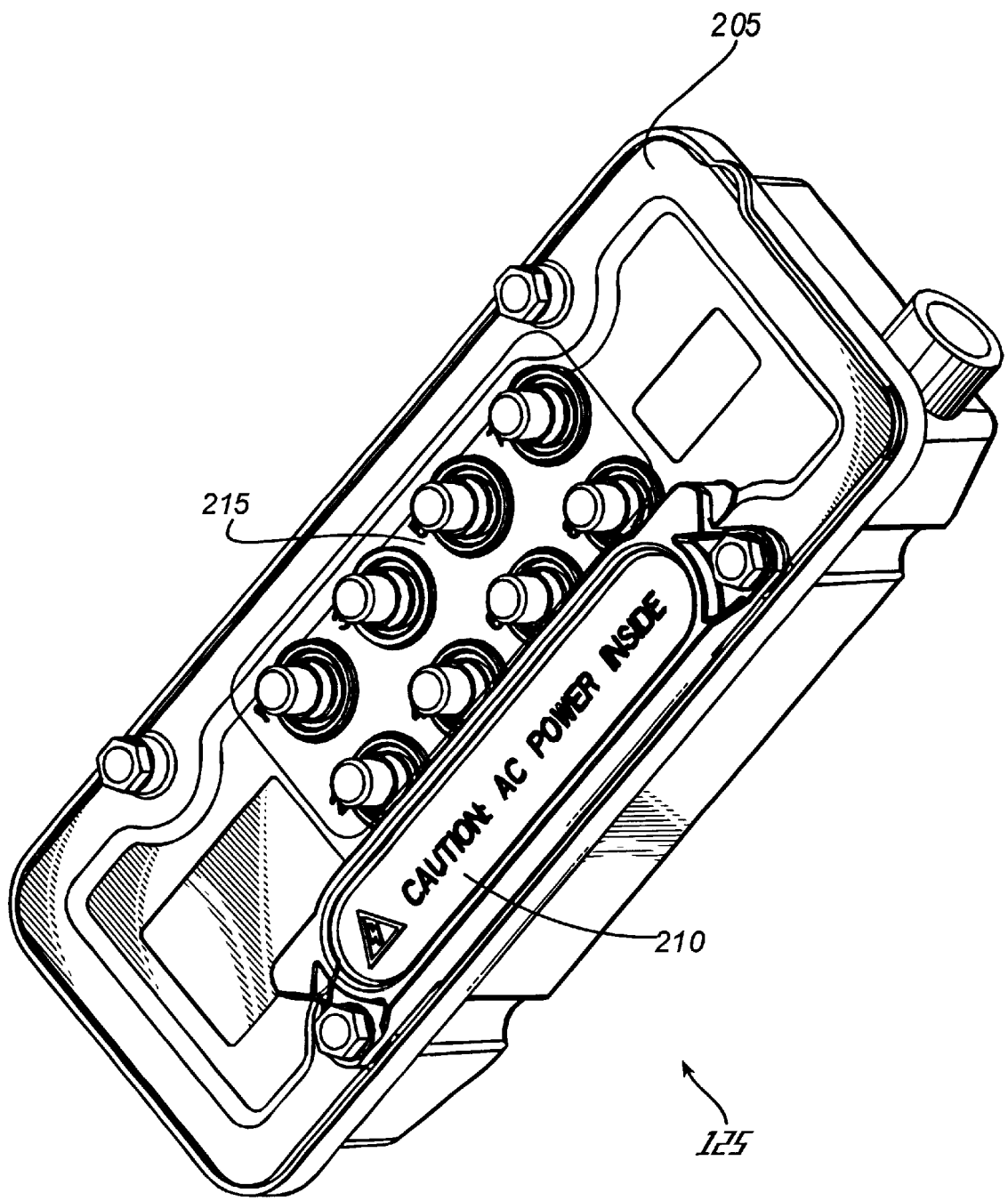
FIG. 2 is a perspective view of a conventional tap included in the cable television system of FIG. 1.

Referring next to FIG. 2, a conventional cable television tap 125 is shown. The tap 125 includes a plurality of subscriber ports, each of which generally serves the subscriber equipment 130 for a single subscriber. The forward signal is provided from the subscriber ports to the subscriber equipment 130 by coaxial connectors 215 mounted to the exterior of the tap housing 205. By way of example, the tap 125 can include eight subscriber ports and corresponding coaxial connectors 215, as shown, or a different number of ports and connectors, as required by the parameters of the system 100. The tap 125 can also include a technician access panel 210 that can be removed to permit technician access to the interior of the tap 125.

Figure 3:
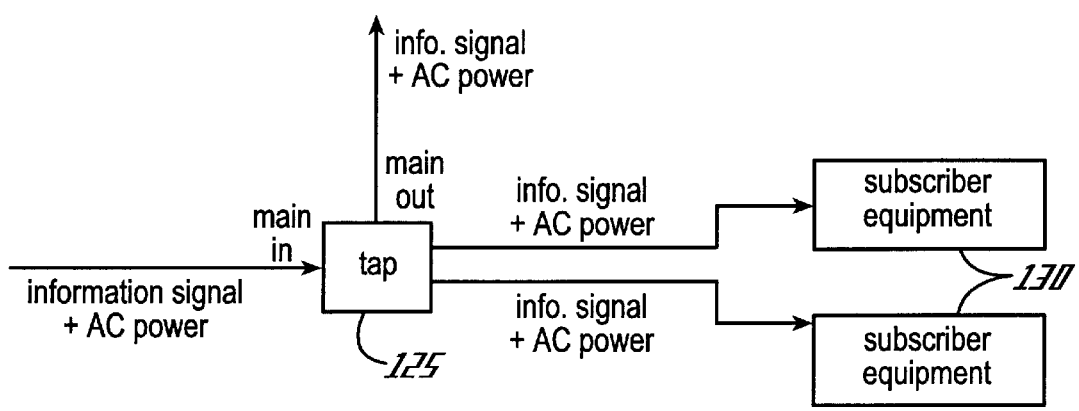
FIGS. 3 and 4 are electrical block diagrams of conventional devices used in a conventional cable television system to separately provide information signals and AC power from the tap of FIG. 2 to a subscriber.

FIG. 3 shows use of a two-port conventional tap 125 for providing forward signals to the subscriber equipment 130. As shown, the forward signal, including the information signal and the AC power signal, is received by the tap 125 at its main input and forwarded throughout the cable television system 100 at its main output. The forward signal is split off at the subscriber ports to provide the forward signal, including the information signal and the AC power signal, to the subscriber equipment 130. It will be appreciated that the tap 125 is shown as having two subscriber ports for illustration purposes only, and that different numbers of subscriber ports are often included in the tap 125.

The arrangement of FIG. 3 provides both information and AC power to each subscriber over a single communication medium, e.g., a coaxial cable, that is coupled between the subscriber port of the tap 125 and the subscriber equipment 130 located in the subscriber premises. Although this configuration is simple, local regulations of some geographic regions prohibit the supply of information signals and AC power signals over a single coaxial cable that travels across the subscriber property. In such regions, the AC power must be separated from the information signal.

Figure 4:
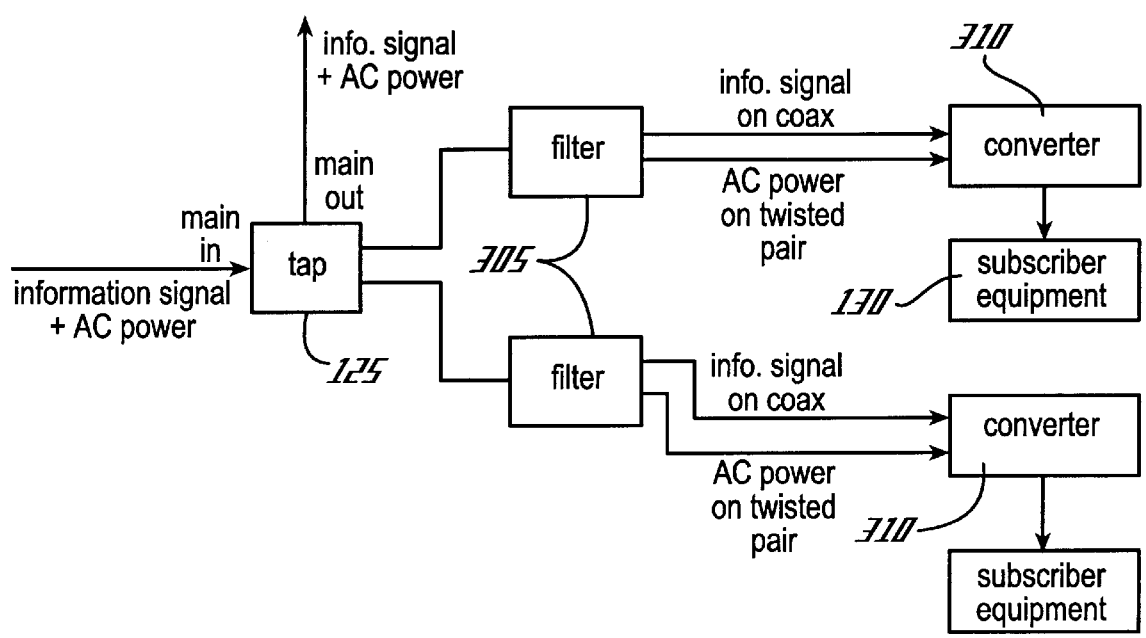

Referring next to FIG. 4, a conventional configuration is shown in which the AC power and the information signal are separately transmitted over the subscriber property to the subscriber equipment 130. As shown, the forward signal, including both information and AC power, is provided at each subscriber port of the tap 125. An external filter 305 is also provided for connection at each subscriber port for separating the AC power signal from the information signal. The information signal is then transmitted across the subscriber premises on a coaxial cable, and the AC power signal is separately transmitted across the subscriber premises on a twisted pair cable. The signals are recombined by a converter 310 located at or within the subscriber residence or business and can then be provided as a single forward signal, including information and AC power, to the subscriber equipment 130.

Although this approach complies with regulations that prohibit the transmission of AC power and information over the subscriber premises on a single coaxial cable, such an approach requires a large amount of hardware since a filter 305 for separating the AC power and the information must be situated at the output of each subscriber port of the tap 125. By way of example, an eight-port tap (not shown) must be used in conjunction with eight separate filter devices 305, each of which is coupled to a subscriber port. It can be seen that this method for complying with local regulations can, in larger systems, become extremely expensive and can result in over crowding of the overhead areas in which the taps 125 are situated with additional hardware, all of which presents additional opportunities for system failure.

Figure 5:
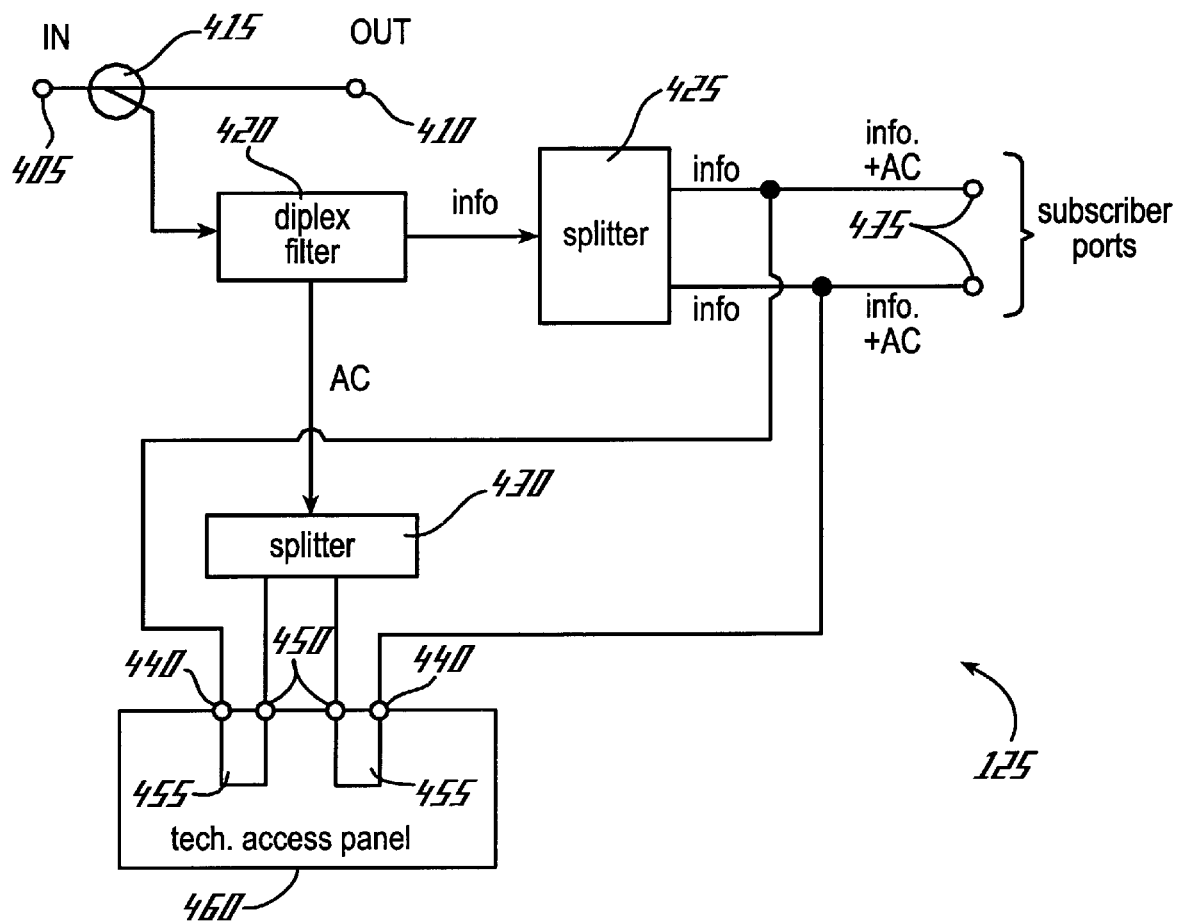
FIG. 5 is an electrical block diagram of the conventional tap of FIG. 2.

FIG. 5 shows an electrical block diagram of the conventional tap 125, which includes a main input terminal 405 for receiving the forward signal and a main output terminal 410 for transmitting the forward signal downstream within the cable television system 100. A portion of the forward signal is split off by a directional coupler 415, an output of which is coupled to a diplex filter 420 or other device that separates signals by frequency. The diplex filter 420 separates the AC power signal from the information signal, both of which are then provided to splitters 425, 430 for splitting, respectively, the information signal and the AC power signal into a number of signals dictated by tap configuration. When, as shown, the tap 125 includes two subscriber ports 435, the splitter 425 splits the information signal into two information signals, and the splitter 430 splits the AC power signal into two AC power signals.

In the conventional tap 125, the AC power signals that are transmitted by the splitter 430 are provided at technician access outputs 450. When the technician access panel 460 is removed from the tap 125, the outputs 450 can be accessed to monitor tap operations. When the technician access panel 460 is secured to the tap 125, each of the technician access outputs 450 is coupled to a technician access input 440 by circuitry included within the panel portion 460. The panel 460 can, for instance, include jumpers or fuses that couple each output 450 to its respective input 440. Each split portion of the AC power signal is then recombined with a split portion of the information signal so that forward signals, including both information and AC power, are provided to the subscriber ports 435.

Figure 6:
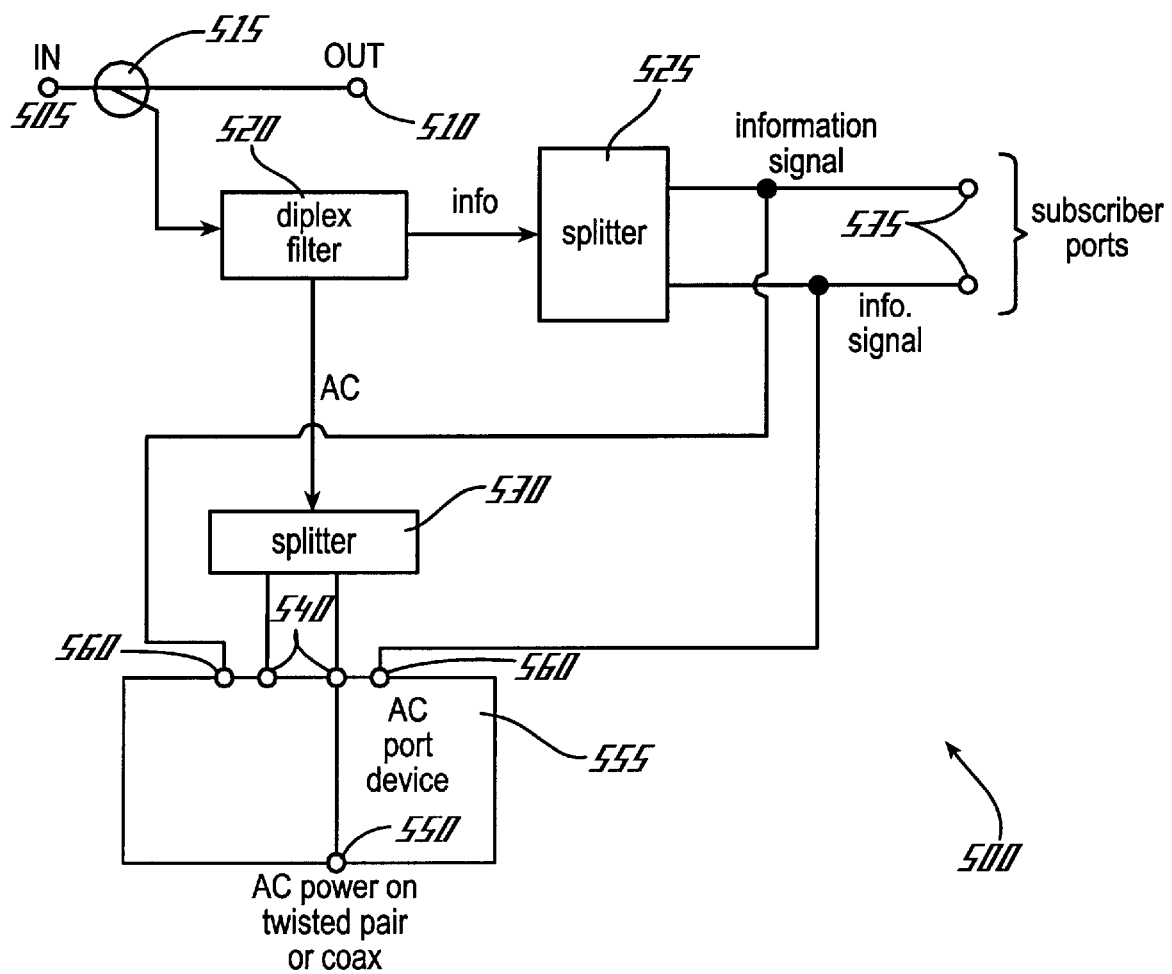
FIG. 6 is an electrical block diagram of a cable television tap according to the present invention.

FIG. 6 is an electrical block diagram of a cable television tap 500 in accordance with the present invention. The tap 500, like conventional tap 125, includes a main input terminal 505, a main output terminal 510, a directional coupler 515, a diplex filter 520, and splitters 525, 530, all of which have functions similar to those of corresponding items included in the conventional tap 125. According to the present invention, however, the tap 500 can isolate the AC power signals from the information signals by providing the AC power signals split by the splitter 530 to technician access outputs 540. The AC power signals are, at outputs 540, coupled to an AC port device 555, which is removable and detachable. The AC port device 555 electrically couples to at least one of the AC power signals and provides AC power on an AC power terminal 550 that can be accessed from the exterior of the tap 500 and the AC port device 555.

Preferably, the AC port device 555 can be physically mounted on the tap 500 to replace an existing technician access panel 460 (FIG. 5). The AC port device 555 provides AC power at the AC power terminal 550 and, at the same time, mechanically and electrically disconnects the technician access outputs 540 from any technician access inputs 560. As a result, the AC power signals are decoupled from the inputs 560 and therefore from the subscriber ports 535 to isolate the AC power signals from the information signals.

Figure 7:
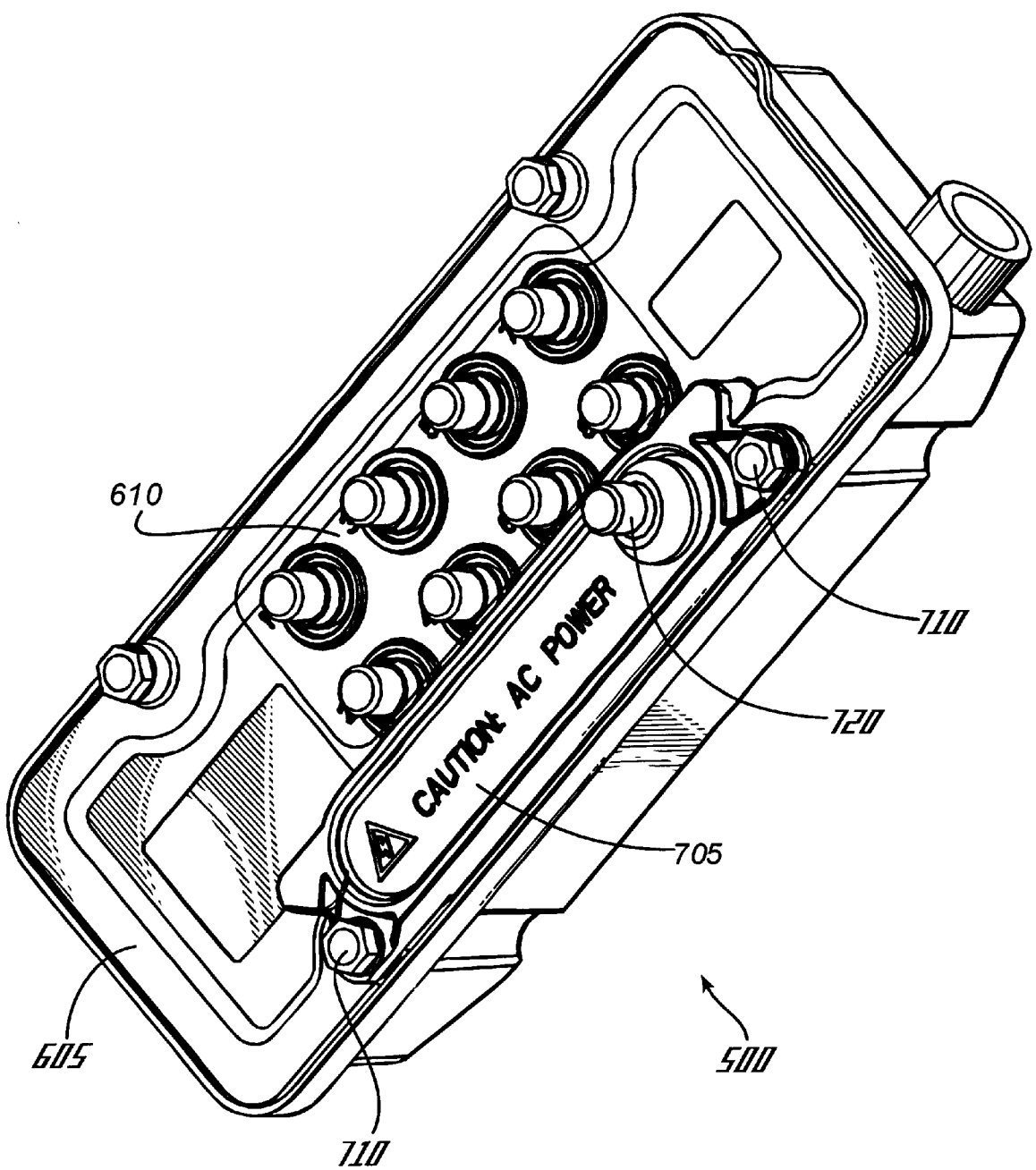
FIG. 7 is a perspective view of cable television tap according to the present invention.

Referring next to FIG. 7, a perspective view of the tap 500 according to the present invention is shown. The tap 500 includes a plurality of subscriber ports, each of which generally serves subscriber equipment 130 of a single subscriber. The forward signal is provided from the subscriber ports to the subscriber equipment 130 by coaxial connectors 610 mounted on the exterior of the tap housing 605. The tap 500 further includes the AC port device 555, which includes a body portion 705 and mounting devices 710, such as screws, for securing the body portion 705 to the tap housing 605. The AC port device 555 also includes a connector 720, such as a coaxial connector or twisted pair connector, for providing the AC power signal at the exterior of the tap 500.

Figure 8:
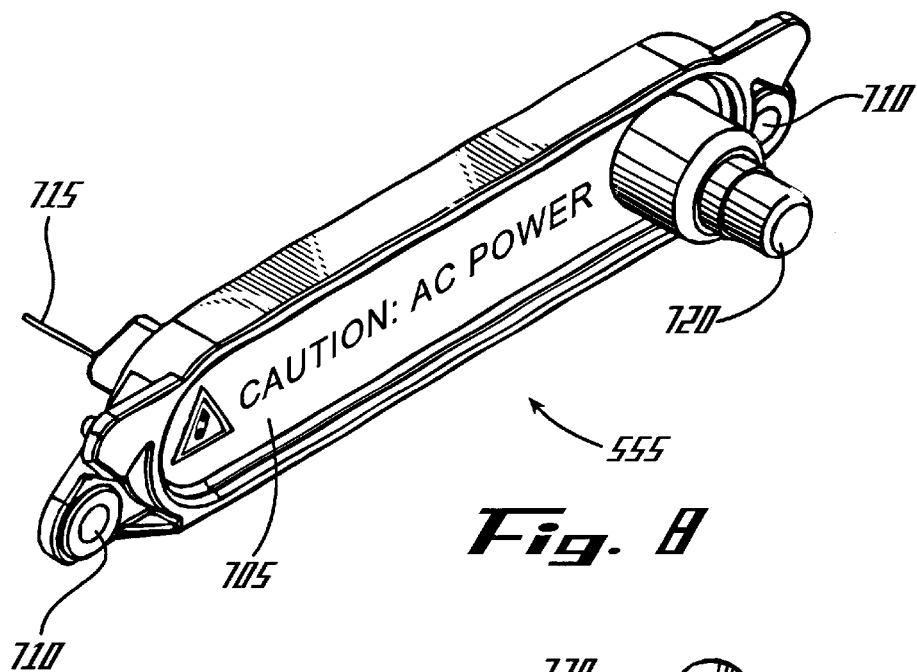
FIGS. 8–10 are front perspective, rear perspective, and side views of an AC port device included in the cable television tap of FIG. 7 according to the present invention.
Figure 9:
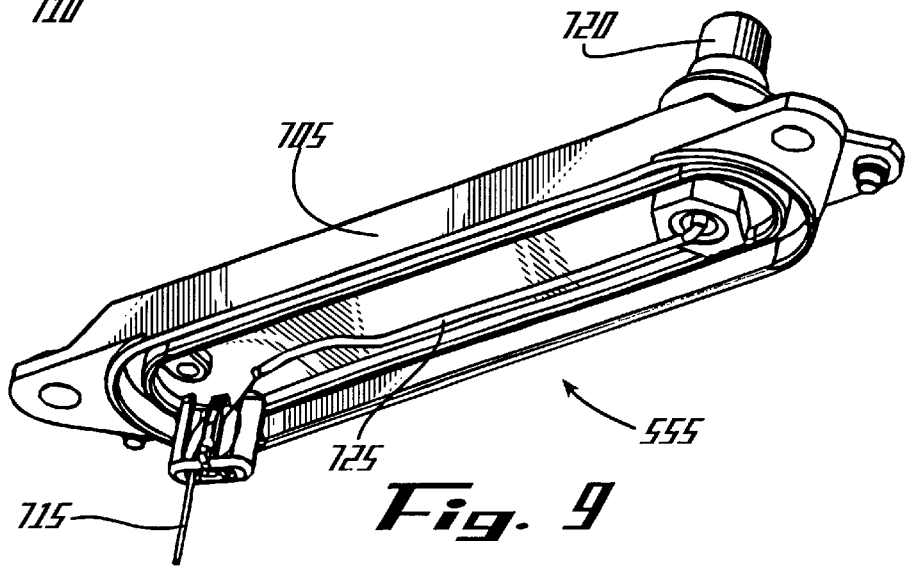
Figure 10:
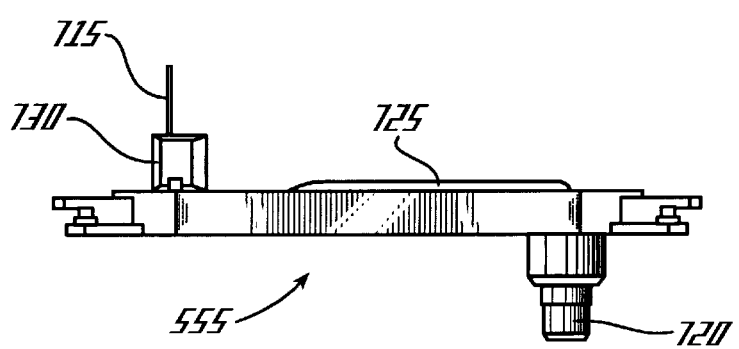

FIGS. 8–10 show different views of the AC port device 555 as it appears when detached from the tap 500. These views illustrate the use of an internal connector 715 that is positioned on a surface of the body portion 705 to mate, mechanically and electrically, with its corresponding technician access output 540 (FIG. 6) when the AC port device 555 is mounted to the tap 500. The connector 715 is electrically coupled to the coaxial connection 720 by a wire 725 or other means, such as a printed circuit board or flexible circuitry (not shown). The connector 715 can, for instance, be formed from a two-terminal positive temperature coefficient device 730 or other two-terminal fuse device from which a single terminal has been physically disconnected.

Figure 11:
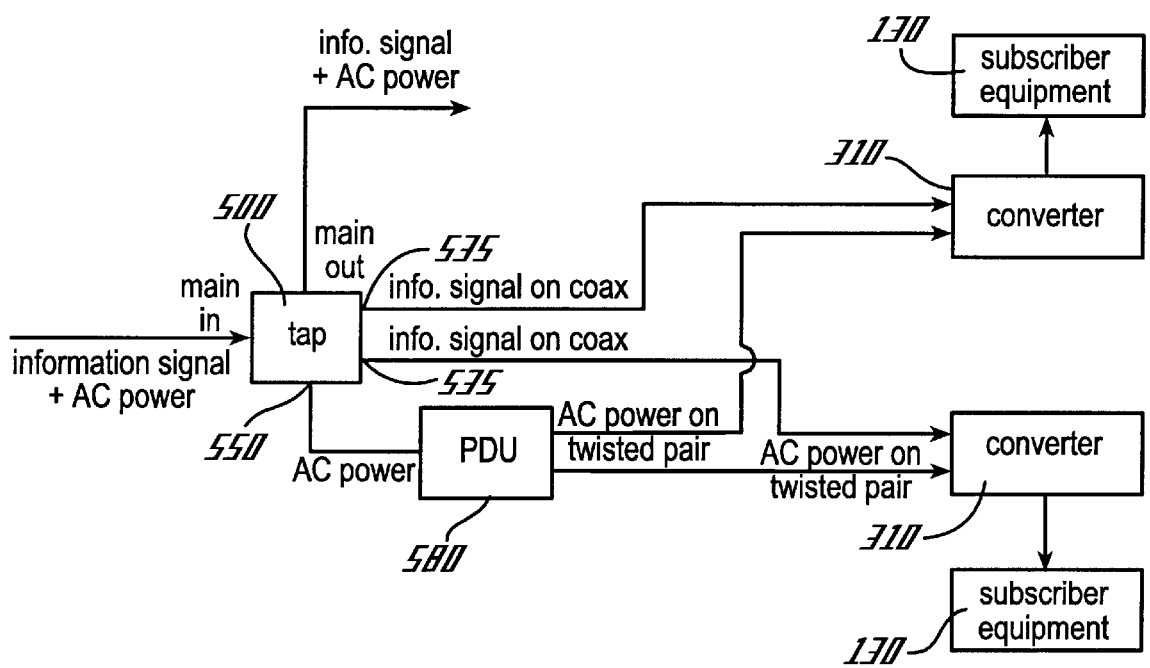
FIG. 11 is an electrical block diagram of the tap of FIG. 6 as used to separately provide information signals and AC power from the tap to a subscriber.

FIG. 11 is a block diagram showing use of the tap 500 within a cable television system 100 in accordance with the present invention. As shown, the tap 500 receives the forward signal and provides, via the AC port device connector 550, a single AC power output and, via the subscriber ports 535, a plurality of information signal outputs. The AC power signal and the information signals can, for example, be accessed through coaxial communication media. The AC power signal output of the tap 500 can be transmitted to a conventional power distribution unit (PDU) 580 that is physically located near the tap 500 and that splits the AC power signal into a plurality of AC power signals that are provided at subscriber outputs of the PDU 580. Each output signal of the PDU 580 can be transmitted over the subscriber premises on a twisted pair cable that carries an AC power signal and no information signal. Each subscriber output of the tap 500 can be transmitted over the subscriber premises on a coaxial cable that carries an information signal and no AC power signal. For each subscriber, the AC power signal and separately transmitted information signal can then be combined by a converter 310 located at or within the subscriber business or residence for transmission to the subscriber equipment 130.

In this manner, AC power signals and information signals can be separately transmitted across the subscriber property in compliance with local regulations, and such transmission only requires the addition of a single conventional PDU 580 per tap 500. If, on the other hand, the system 100 includes conventional taps 125, additional filter devices 305 (FIG. 4) must be included for each subscriber port of each tap 125. It will be appreciated by now that use of the tap 500 according to the present invention permits the use of less hardware and can therefore result in a less expensive cable television system 100.

What is claimed is:

1. A cable television tap for receiving a forward signal comprising an information signal and a power signal, the cable television tap comprising:

a separation device for receiving the forward signal and for separating the information signal from the power signal at its outputs;

a plurality of subscriber ports coupled to the separation device for receiving the information signal such that the information signal can be accessed at each of the plurality of subscriber ports, a port device coupled to the separation device for receiving the power signal, the port device including a coaxial connector for providing the power signal;

wherein the information signal cannot be accessed at the coaxial connector of the port device, and the power signal cannot be accessed at any of the plurality of subscriber ports;

a housing for enclosing the separation device and the plurality of subscriber ports, wherein the port device is detachable from the housing; and a panel that can be attached to the housing to replace the port device.

2. A cable television tap for receiving a forward signal comprising an information signal and a power signal, the cable television tap comprising:

an input terminal for receiving the forward signal;

an output terminal coupled to the input terminal for transmitting the forward signal through the cable television tap;

a diplex filter for receiving the forward signal and for separating the information signal from the power signal at its outputs;

a plurality of subscriber ports coupled to the diplex filter for receiving the information signal such that the information signal can be accessed at each of the plurality of subscriber ports;

a port device coupled to the diplex filter for receiving the power signal, the port device including a coaxial connector for providing the power signal, wherein the port device is detachably mounted to the cable television tap; and a panel that can be attached to a housing of the cable television tap to replace the port device.

3. A cable television system for providing a forward signal comprising an information signal and a power signal to subscriber equipment, the cable television system comprising:

headend equipment for generating the information signal;

a node coupled to the headend equipment for generating the power signal and for combining the information signal and the power signal for transmission throughout the cable television system as the forward signal; and a tap for receiving the forward signal, the tap comprising:

a separation device for separating the information signal from the power signal at outputs of the separation device;

a plurality of subscriber ports coupled to the separation device for receiving the information signal such that the information signal can be accessed at each of the plurality of subscriber ports;

a port device coupled to the separation device for receiving the power signal, the port device including a coaxial connector for providing the power signal;

a housing for enclosing the separation device and the plurality of subscriber ports, wherein the port device is detachable from the housing; and a panel that can be attached to the housing to replace the port device.

4. The cable television system of claim 3, wherein, when the panel rather than the port device is mounted to the housing of the tap, both the power signal and the information signal are provided to the plurality of subscriber ports.

* * * * *